(12) United States Patent
Wang et al.

(10) Patent No.: US 11,683,046 B2
(45) Date of Patent: *Jun. 20, 2023

(54) SYSTEM FOR AND METHOD OF CANCELLING A TRANSMIT SIGNAL ECHO IN FULL DUPLEX TRANSCEIVERS

(71) Applicant: Avago Technologies International Sales Pte. Limited, Singapore (SG)

(72) Inventors: Jingguang Wang, Irvine, CA (US); Jing Wang, Irvine, CA (US); Robert Roze, Irvine, CA (US); Kambiz Vakilian, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,807

(22) Filed: Aug. 1, 2022

(65) Prior Publication Data

US 2022/0368335 A1  Nov. 17, 2022

Related U.S. Application Data

(63) Continuation of application No. 17/160,618, filed on Jan. 28, 2021, now Pat. No. 11,405,044.

(60) Provisional application No. 63/112,990, filed on Nov. 12, 2020.

(51) Int. Cl.
*H03M 1/66* (2006.01)
*H03M 1/00* (2006.01)
*H03M 1/08* (2006.01)
*H03M 1/68* (2006.01)
*H03M 1/74* (2006.01)
*H03M 1/76* (2006.01)

(52) U.S. Cl.
CPC ......... *H03M 1/005* (2013.01); *H03M 1/0881* (2013.01); *H03M 1/682* (2013.01); *H03M 1/747* (2013.01); *H03M 1/765* (2013.01)

(58) Field of Classification Search
CPC .... H03M 1/005; H03M 1/0881; H03M 1/682; H03M 1/747; H03M 1/765
See application file for complete search history.

(56) References Cited

U.S. PATENT DOCUMENTS

| 7,729,300 B1 | 6/2010 | Ziazadeh et al. |
| 8,254,490 B2 * | 8/2012 | Chandra ............... H04B 3/23 375/219 |
| 2012/0014419 A1 | 1/2012 | Chandra |

OTHER PUBLICATIONS

Extended European Search Report (EESR) dated Apr. 4, 2022 for application No. 21201827.9-1216.

* cited by examiner

*Primary Examiner* — Joseph J Lauture
(74) *Attorney, Agent, or Firm* — Foley & Lardner LLP

(57) ABSTRACT

The systems and methods discussed herein utilized a wireless or wired transceiver having a transmitter and a receiver. The transceiver is configured to reduce distortion contributions associated with echo cancelling. The transmitter provides a replica signal and a transmit signal. The replica signal and the transmit signal can be provided using a common switch.

20 Claims, 5 Drawing Sheets

SYSTEM FOR AND METHOD OF CANCELLING A TRANSMIT SIGNAL ECHO IN FULL DUPLEX TRANSCEIVERS

CROSS-REFERENCE TO RELATED PATENT APPLICATIONS

This application is a continuation of U.S. patent application Ser. No. 17/160,618, filed Jan. 28, 2021, which claims the benefit of and priority to U.S. Provisional Application No. 63/112,990, filed Nov. 12, 2020, both of which are incorporated by reference herein in its entirety.

FIELD OF THE DISCLOSURE

This disclosure generally relates to systems and methods for data communications. In particular, this disclosure relates to systems and methods for full duplex communications.

BACKGROUND

Bidirectional high speed data communications can utilize full duplex communication over one or more conductors (e.g. twisted pairs, single pair cables, etc.) or in wireless environments. Full duplex communication often involves transmit and receive signals imposed on top of each other. A transceiver for implementing full duplex communications includes a transmitter and a receiver. The transmitter can provide echo cancelling by providing an echo signal to the receiver that is used to remove the transmitted signal from the signal received at the receiver. However, the use of the echo signal can add distortion.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
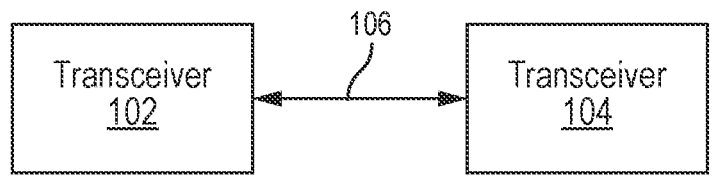
FIG. 1 is a general schematic block diagram of a wired full duplex communication system according to some embodiments.

The following IEEE standard(s), including any draft versions of such standard(s), are hereby incorporated herein by reference in their entirety and are made part of the present disclosure for all purposes: IEEE P802.3™. Although this disclosure may reference aspects of these standard(s), the disclosure is in no way limited by these standard(s).

For purposes of reading the description of the various embodiments below, the following descriptions of the sections of the specification and their respective contents may be helpful:

Section A describes embodiments of systems and methods for full duplex communication; and Section B describes a network environment and computing environment which may be useful for practicing embodiments described herein.

A. Systems and Methods for Full Duplex Communication

Communication systems, including but not limited to: IEEE P802.3ch for Multi-Gig (10 Gbps, 5 Gbps and 2.5 Gbps), IEEE 802.3bp for 1000BASE-T1 (1 Gbps) and 802.3bw for 100BASE-T1 (100 Mbps) Automotive Ethernet communication systems, utilize full-duplex communications over single-pair cables and can utilize echo cancellation. The echo cancellation requirements can increase the physical form factor of transceivers, can increase the heat dissipation requirement, and can contribute distortion.

In some embodiments, the communication systems include a transceiver having a transmitter and a receiver. The transmitter and receiver can be provided on an integrated circuit housed in a package including input/output pins coupled to the one or more conductors or an antenna in some embodiments. The transceiver is configured to reduce distortion contributions associated with echo cancelling in some embodiments. For example, the transmitter can use a transmit (TX) digital-to-analog converter (DAC) portion to drive an output signal, Vtx_m, at one or more shared input/output pins. The one or more shared input/output pins generally receive a receive signal or linked partner signal, Vrx_m, intended to be received at the receiver. The output signal, Vtx_m, generally combines with the linked partner signal, Vrx_m, intended to be received at the receiver. The transmitter also includes an echo DAC portion (a replica of the TX DAC portion) that sends the same output signal (e.g., a copy of the transit signal, Vtx_m) separately to the receiver so it can be subtracted from the combined signal (Vtx_m+Vrx_m) at or before the receiver in some embodiments. Once the copy of the signal Vtx_m is subtracted from the combined signals, only the linked partner signal Vrx_m remains for detection and processing in in some embodiments. The communications system and/or the transceiver is advantageously configured to reduce the uncorrelated distortion from the TX DAC and Echo DAC portions in some embodiments.

Applicants have found that the energy from the summed distortion at receiver input can degrade signal to noise and distortion ratio (SNDR) of the communication channel and increase complexity of the system. Applicants have also found that the active switches in the TX DAC and Echo DAC are the main source of the distortion in each DAC especially if the switches are not well matched in some embodiments.

Since both local transmit (TX) and receive (RX) signals are combined at the interface (e.g., medium dependent interface (MDI) pins), the TX DAC provided TX signal at the RX input (e.g., the echo signal) must be removed by the local receiver leaving little or no residual effect at the receiver detector. Any remaining TX residual signal will behave as noise and degrade receiver's performance in some embodiments. A replica TX DAC is used to regenerate the TX signal (e.g. the replica TX signal) so that the replica TX signal can be subtracted from the RX signal at the receiver input in some embodiments. The independent nonlinear distortion and noise provided by the TX DAC and the replica TX DAC do not cancel and remain at the receiver input which degrades the receiver's performance. In some embodiments, the systems and methods remove echo from the full duplex communication system without contributing to distortion. In some embodiments, the systems and methods reduce distortion associated with independent nonlinear distortion and noise provided by the TX DAC and the replica TX DAC. In some embodiments, the system and methods are used in any type Ethernet transceiver designs, wireless transceivers as well any other full duplex communication circuit.

Some embodiments relate to a transmitter including a first digital-to-analog converter circuit disposed on substrate, a second digital-to-analog converter circuit disposed on the substrate; and an active circuit disposed on the substrate for the first digital-to-analog converter circuit and the second digital-to-analog converter circuit. The active circuit has a common switch for the first digital-to-analog converter circuit and the second digital-to-analog converter circuit, and the second digital-to-analog converter circuit is configured to provide a replica signal for echo cancelling.

Some embodiments relate to a method including providing a digital input to a first digital-to-analog converter circuit disposed on substrate and a second digital-to-analog converter circuit disposed on the substrate. The method also includes switching an active circuit disposed on the substrate for the first digital-to-analog converter circuit and the second digital-to-analog converter circuit using the digital input to provide a transmit signal and a replica signal. The first digital-to-analog converter circuit and the second digital-to-analog converter circuit share a switch in the active circuit. The method also includes providing the replica signal to a summer for echo cancelling.

Some embodiments relate to a transceiver. The transceiver includes a transmitter, a summer, and a receiver. The transmitter includes a first digital-to-analog passive circuit comprised of first passive elements, a second digital-to-analog passive circuit comprised of second passive elements, and switches for the first digital-to-analog passive circuit and the second digital-to-analog passive circuit. The switches comprises a common switch for the first digital-to-analog passive circuit and the second digital-to-analog passive circuit. The second digital-to-analog passive circuit is configured to provide a replica signal, and the first digital-to-analog passive circuit is configured to provide a transmit signal.

Figure 2:
FIG. 2 is a general schematic block diagram of a wireless full duplex communication system according to some embodiments.

With reference to FIG. 1, a communication system 10 includes a first transceiver 102 and second transceiver 104 in communication via a twisted pair conductive medium, single-pair conductive medium, coaxial cable, or conductor 105 in some embodiments. In some embodiments, the communication system 10 is wireless communication system (FIG. 2) and does not include conductor 105 or use a conductor 105 for duplex communications. The communication system 10 can be an asymmetric communication system and can be utilized in or with the applications and components described in U.S. Pat. No. 8,929,198, assigned to the assignee of the present application and incorporated herein by reference in its entirety. Conductor 105 can be a conductor or conductors for a controller area network (CAN) bus, an ethernet bus or other communication link. Conductor 105 can be any communication medium for duplex communications in some embodiments.

The transceivers 102 and 104 may be part of other devices (not illustrated), such as vehicle components, computing devices, cameras, displays, network devices, or any other type and form of electronic device utilizing a communications system. The transceivers 102 and 104 are implemented as part of a network and are in a master slave relationship in some embodiments. In some embodiments, transceivers 102 and 104 include a high speed or low speed transmitter and receiver. High speed and low speed are used as relative terms, but may represent data rates in excess of 10:1, 100:1, or 1000:1, such as a gigabit rate (or faster) in one direction, and a megabit rate in the other direction (or on similar orders). In many implementations, to allow full duplex communications, the high and low speed transmissions may be centered at different frequencies, such as a GHz range for a high speed transmission and a MHz range for a low speed transmission. The transceivers 102 and 104 can be part of large or small networks and be ethernet transceivers, wireless transceivers, or other full duplex communication circuits.

In some embodiments, encoding protocols such as 8b/10b or other line code mapping schemes may be used to shape a high speed transmission signal to control echoes; however, due to the increased clock rate of 25% for such transmissions, such implementations require higher power and have increased channel loss. In some embodiments, a pre-emphasis filter may be used to shape the high speed transmission spectrum. This may help contain the high speed echoes by reducing low frequency content and may help with signal equalization, reducing cost and power requirements of equalization at the receiver.

Figure 3:
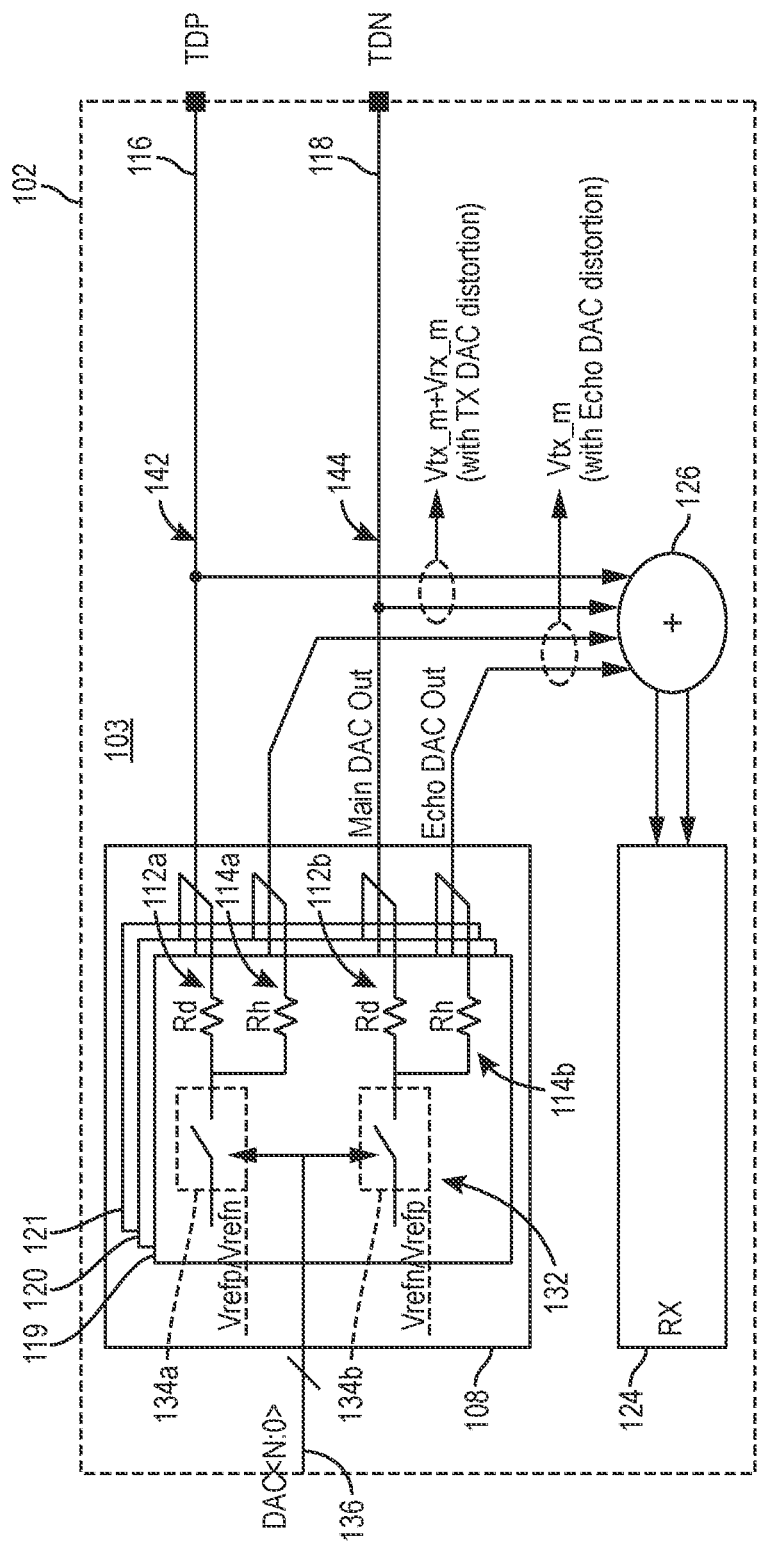
FIG. 3 is a more detailed schematic block diagram of a transceiver for the full duplex communication systems illustrated FIGS. 1 and 2 according to some embodiments.

With reference to FIG. 3, transceiver 102 is provided on a physical (PHY) chip or integrated circuit 103 in a package. In some embodiments, transceiver 102 includes a digital to analog converter (DAC) 108. DAC 108 has one or more transmit DAC circuits 112a-b coupled to an I/O pin interface (e.g., a positive pin 116 and a negative pin 118), one or more echo or replica DAC circuits 114a-b coupled to a receiver 124, and an active circuit 132. In some embodiments, the transceiver 102 includes a summer 126 coupled to the pins 116 and 118 and outputs of the replica DAC circuits 114a-b. The integrated circuit 103 includes a substrate that includes the DAC circuits 112a-b, the echo or replica DAC circuits 114a-b, and the active circuit 132.

DAC circuits 112a-b and 114a-b provide two output signals (e.g., a transmit signal and a replica signal for echo cancelling) and are passive circuits in some embodiments. The DAC 108 is a voltage DAC, a current DAC, or other DAC type.

The DAC 108 includes multiple legs 119, 120, and 121 in some embodiments. Leg 119 includes DAC circuits 112a-b, the echo or replica DAC circuits 114a-b, and the active circuit 132. Each of legs 120 and 121 includes DAC circuits similar to DAC circuits 112a-b and 114a-b, and an active circuit similar to the active circuit 132. DAC circuits 112a-b and 114a-b are each comprised of passive elements, such as resistors, inductors, or capacitors in some embodiments. In some embodiments, DAC circuits 112a-b include resistors Rd, and DAC circuits 114a-b include resistors Rh. DAC circuits 112b and 114b include one array of passive elements for a negative line 144, and DAC circuits 112a and 114a include an array of passive elements for a positive line 142. Although four resistors Rh and Rd are shown, DAC circuits 112b and 114b can include any number of elements. The mismatch for the passive elements is generally small in some embodiments. Although three legs 119, 120 and 121 are shown, the DAC 108 can include legs of any number. Each of legs 119, 120, and 121 can be associated with one or more input bits (N:0) which drive the active circuits for each leg 119, 120, and 121.

Advantageously, the DAC 108 of transceiver 102 includes a DAC active circuit 132 that is shared with the transmit DAC circuits 112a-b and the replica DAC circuits 114a-b for the main TX DAC signal(Vtx_m across positive line 142 and negative line 144) and echo DAC signal (Vtx_m provided from resistors Rh), respectively. The DAC active circuit 132 includes active components for the DAC circuits 112a-b and DAC circuits 114a-b. The DAC active circuit 132 includes a shared switch circuit (e.g., shared switches 134a-b) driven by DAC input 136. A separate shared switch 134a-b is provided for each of the positive line 142 and the negative line 144 in some embodiments. Shared switch 134a is used with DAC circuits 112a and 114a, and shared switch 134b is use with DAC circuits 112b and 114b. Using the shared switches 134a-b for each of circuits 112a-b and 114a-b reduces mismatching and, therefore, distortion in some embodiments. In some embodiments, each shared switch 134a-b is a combination of two or more switches (e.g., arranged in serial or parallel). Although only one shared switch 134a is shown for DAC circuits 112a and 114a in FIG. 3, circuits with multiple switches and active components can be used as shared switch 134a or 134b. In some embodiments, the nonlinearity from the switch which contributes the main distortion in a conventional DAC is completely cancelled by using the shared switch 134a between the main DAC circuit 112a and the replica DAC circuit 114a. In some embodiments, the nonlinearity from the switch which contributes the main distortion in a conventional DAC is completely cancelled by using the shared switch 134b between the main DAC circuit 112b and the replica DAC circuit 114b.

The active circuit 132 comprise switches 134a-b that are often associated with distortion. The switches 134a-b include transistors (e.g., complementary Metal Oxide semiconductor (CMOS) filed effect transistors, bipolar transistors, etc.) in some embodiments. Perfect, near perfect, or enhanced active device matching can be accomplished, and uncorrelated nonlinear distortion can be removed by using shared switches 134a-b in some embodiments. In addition, the transmit DAC circuits 112a-b linearity improves by using the shared switches 134a-b for little or no additional cost in some embodiments. The active circuit 132 allows TX echo residue to be removed in a full duplex transceiver design and improves system signal to noise, link reliability, and distortion ratio and bit error rate in some embodiments. In some embodiments, the nonlinearity from the switch or switches which contribute the main distortion in a conventional DAC is completely cancelled by using the shared switches 134a-b between the respective main DAC circuits 112a-b and the respective replica DAC circuits 114a-b.

The summer 126 receives the signals on the pins 116 and 118 transmit and receive signals (Vtx_m+Vrx-m) and performs echo cancelling in some embodiments. The Vtx_m signal from the replica DAC circuits 114a-b is subtracted from the mixed signal at the pins 116 and 118 to provide only the Vrx_m signal to the receiver 124. Since the distortion contributed by the DAC circuits 112a-b and the DAC circuits 114a-b is similar due to the use of the same active circuit 132, distortion is reduced in the summer 126 (e.g., the distortion is subtracted out). Transceiver 104 is similar to transceiver 102 in some embodiments and employs the same DAC architecture in some embodiments.

In some embodiments, the use of active circuit 132 provides an area efficient, cost reduced DAC design that is less process dependent and therefore improves production yield. In some embodiments, in a full duplex embodiments of transceiver 102 (e.g., Ethernet communication transceivers), the transmitter (TX) DAC circuits 112a-b and receiver (RX) 124 share the same pins 116 and 118 (Media Dependent Interface (MDI) pins) (e.g., which are connected to link partner pin through conductor 105 (e.g., Ethernet cable)). By combining active circuits of the DAC circuits 112a-b and 114a-b so the switches 134a-b are shared between the DAC circuits 112 and 114, the distortion and noise of the two DAC circuits 112a-b and 114a-b are matched since the active circuit 132 is common. This allows the DAC circuits 114a-b to completely remove or almost completely remove the nonlinearity of Vtx_m at the receiver input and minimize any residual TX signal in some embodiments. This architecture significantly reduces the DAC linearity design requirement in the full duplex system in some embodiments.

B. Computing and Network Environment

Figure 4A:
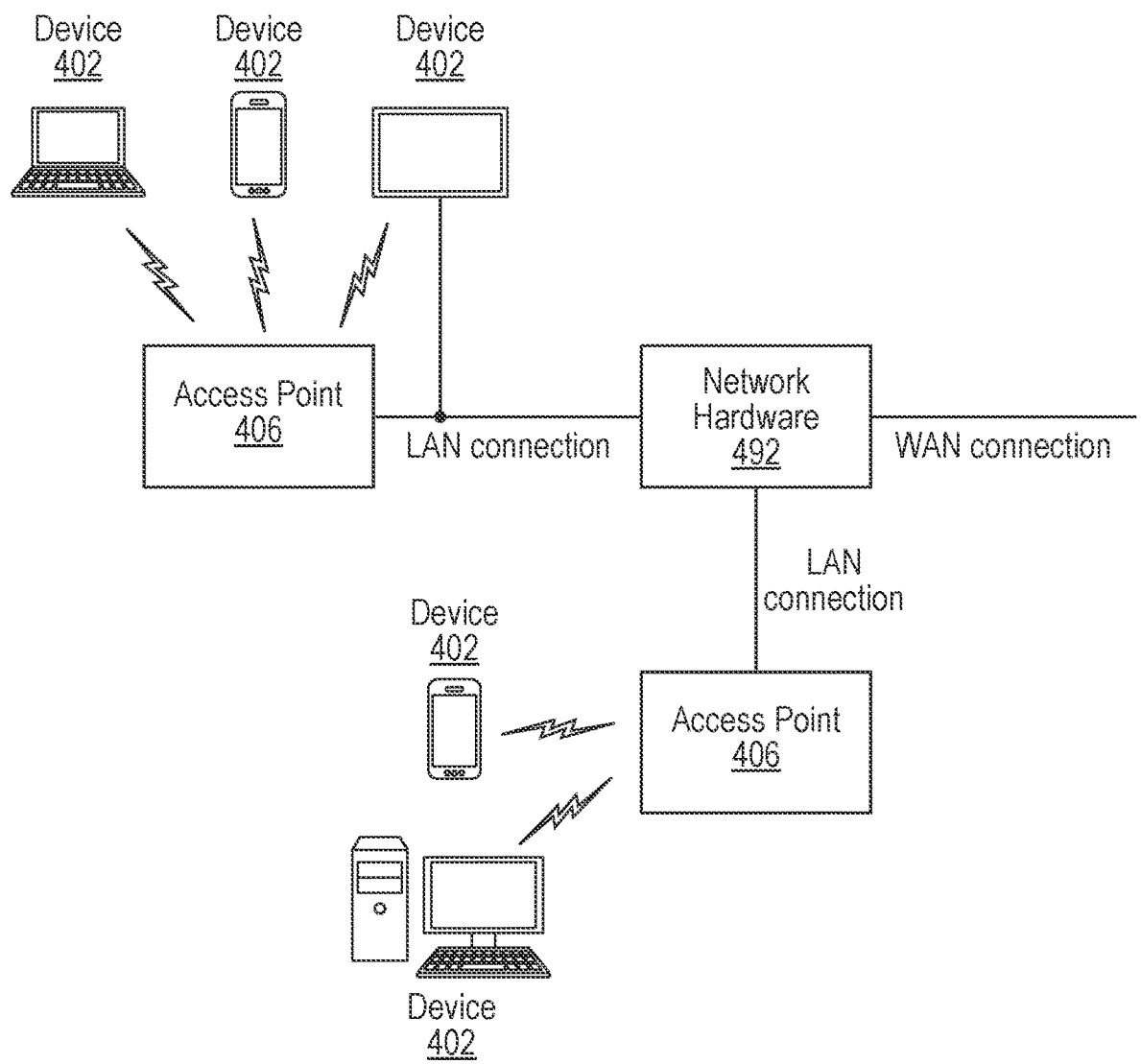
FIG. 4A is a block diagram depicting an embodiment of a network environment including one or more access points in communication with one or more devices or stations.

Having discussed specific embodiments of the present solution, it may be helpful to describe aspects of the operating environment as well as associated system components (e.g., hardware elements) in connection with the methods and systems described herein. Referring to FIG. 4A, an embodiment of a network environment is depicted which can utilize the transceiver 102 illustrated in FIG. 3 according to some embodiments. In brief overview, the network environment includes a wireless communication system that includes one or more access points 406, one or more wireless communication devices 402 which can include transceiver 102 and a network hardware component 492. The wireless communication devices 402 may for example include laptop computers 402, tablets 402, personal computers 402 and/or cellular telephone devices 402. The details of an embodiment of each wireless communication device and/or access point are described in greater detail with reference to FIGS. 4B and 4C. The network environment can be an ethernet, an ad hoc network environment, an infrastructure wireless network environment, a subnet environment, etc. in one embodiment.

The access points (APs) 406 may be operably coupled to the network hardware 492 via local area network connections. The network hardware 492, which may include a router, gateway, switch, bridge, modem, system controller, appliance, etc., may provide a local area network connection for the communication system. Each of the access points 406 may have an associated antenna or an antenna array to communicate with the wireless communication devices 402 in its area. The wireless communication devices 402 may register with a particular access point 406 to receive services from the communication system (e.g., via a SU-MIMO or MU-MIMO configuration). For direct connections (e.g., point-to-point communications), some wireless communication devices 402 may communicate directly via an allocated channel and communications protocol. Some of the wireless communication devices 402 may be mobile or relatively static with respect to the access point 406.

In some embodiments an access point 406 includes a device or module (including a combination of hardware and software) that allows wireless communication devices 402 to connect to a wired network using Wi-Fi, or other standards. An access point 406 may sometimes be referred to as a wireless access point (WAP). An access point 406 may be configured, designed and/or built for operating in a wireless local area network (WLAN). An access point 406 may connect to a router (e.g., via a wired network) as a stand-alone device in some embodiments. In other embodiments, an access point can be a component of a router. An access point 406 can provide multiple devices 402 access to a network. An access point 406 may, for example, connect to a wired Ethernet connection and provide wireless connections using radio frequency links for other devices 402 to utilize that wired connection. An access point 406 may be built and/or configured to support a standard for sending and receiving data using one or more radio frequencies. Those standards, and the frequencies they use may be defined by the IEEE (e.g., IEEE 802.11 standards). An access point may be configured and/or used to support public Internet hotspots, and/or on an internal network to extend the network's Wi-Fi signal range.

In some embodiments, the access points 406 may be used for (e.g., in-home or in-building) wireless networks (e.g., IEEE 802.11, Bluetooth, ZigBee, any other type of radio frequency based network protocol and/or variations thereof). Each of the wireless communication devices 402 may include a built-in radio and/or is coupled to a radio. Such wireless communication devices 402 and/or access points 406 may operate in accordance with the various aspects of the disclosure as presented herein to enhance performance, reduce costs and/or size, and/or enhance broadband applications. Each wireless communication devices 402 may have the capacity to function as a client node seeking access to resources (e.g., data, and connection to networked nodes such as servers) via one or more access points 406.

The network connections may include any type and/or form of network and may include any of the following: a point-to-point network, a broadcast network, a telecommunications network, a data communication network, a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Figure 4B:
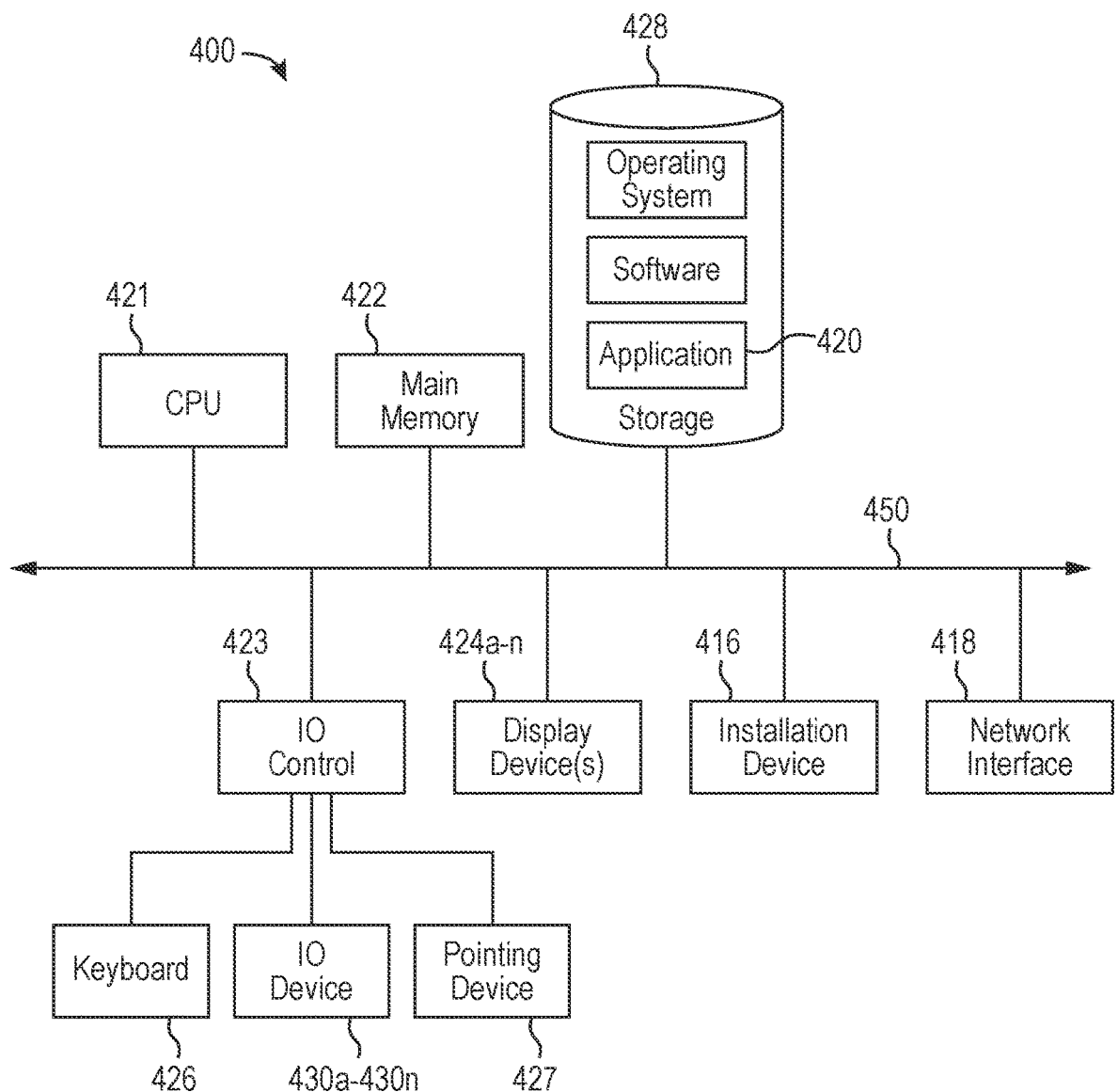
FIGS. 4B and 4C are block diagrams depicting embodiments of computing devices useful in connection with the methods and systems described herein.
Figure 4C:
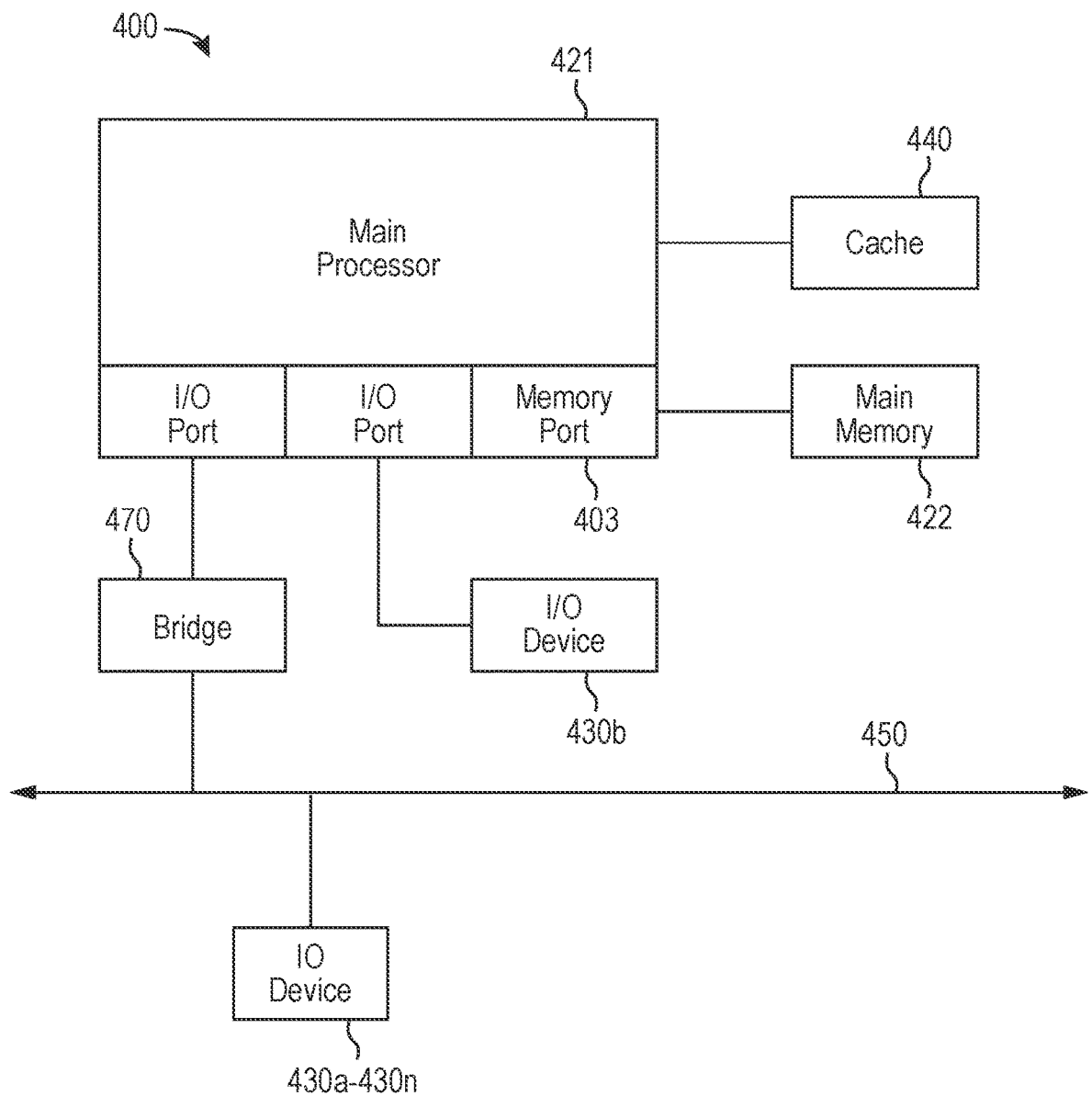

The communications device(s) 402 and access point(s) 406 may be deployed as and/or executed on any type and form of computing device, such as a computer, network device or appliance capable of communicating on any type and form of network and performing the operations described herein. FIGS. 4B and 4C depict block diagrams of a computing device 400 useful for practicing an embodiment of the wireless communication devices 402 or the access point 406. As shown in FIGS. 4B and 4C, each computing device 400 includes a central processing unit 421, and a main memory unit 422. As shown in FIG. 4B, a computing device 400 may include a storage device 428, an installation device 416, a network interface 418, an I/O controller 423, display devices 424a-424n, a keyboard 426 and a pointing device 427, such as a mouse. The storage device 428 may include, without limitation, an operating system and/or software. As shown in FIG. 4C, each computing device 400 may also include additional optional elements, such as a memory port 403, a bridge 470, one or more input/output devices 430a-430n (generally referred to using reference numeral 430), and a cache memory 440 in communication with the central processing unit 421.

The central processing unit 421 is any logic circuitry that responds to and processes instructions fetched from the main memory unit 422. In many embodiments, the central processing unit 421 is provided by a microprocessor unit, such as: those manufactured by Intel Corporation of Mountain View, Calif.; those manufactured by International Business Machines of White Plains, N.Y.; or those manufactured by Advanced Micro Devices of Sunnyvale, Calif. The computing device 400 may be based on any of these processors, or any other processor capable of operating as described herein.

Main memory unit 422 may be one or more memory chips capable of storing data and allowing any storage location to be directly accessed by the microprocessor 421, such as any type or variant of Static random access memory (SRAM), Dynamic random access memory (DRAM), Ferroelectric RAM (FRAM), NAND Flash, NOR Flash and Solid State Drives (SSD). The main memory 422 may be based on any of the above described memory chips, or any other available memory chips capable of operating as described herein. In the embodiment shown in FIG. 4B, the processor 421 communicates with main memory 422 via a system bus 450 (described in more detail below). FIG. 4C depicts an embodiment of a computing device 400 in which the processor communicates directly with main memory 422 via a memory port 403. For example, in FIG. 4C the main memory 422 may be DRDRAM.

FIG. 4C depicts an embodiment in which the main processor 421 communicates directly with cache memory 440 via a secondary bus, sometimes referred to as a backside bus. In other embodiments, the main processor 421 communicates with cache memory 440 using the system bus 450. Cache memory 440 typically has a faster response time than main memory 422 and is provided by, for example, SRAM, BSRAM, or EDRAM. In the embodiment shown in FIG. 4C, the processor 421 communicates with various I/O devices 430 via a local system bus 450. Various buses may be used to connect the central processing unit 421 to any of the I/O devices 430, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 424, the processor 421 may use an Advanced Graphics Port (AGP) to communicate with the display 424. FIG. 4C depicts an embodiment of a computer 400 in which the main processor 421 may communicate directly with I/O device 430b, for example via HYPERTRANSPORT, RAPIDIO, or INFINIBAND communications technology. FIG. 4C also depicts an embodiment in which local busses and direct communication are mixed: the processor 421 communicates with I/O device 430a using a local interconnect bus while communicating with I/O device 430b directly.

A wide variety of I/O devices 430a-430n may be present in the computing device 400. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices may be controlled by an I/O controller 423 as shown in FIG. 4B. The I/O controller may control one or more I/O devices such as a keyboard 426 and a pointing device 427, e.g., a mouse or optical pen. Furthermore, an I/O device may also provide storage and/or an installation medium 416 for the computing device 400. In still other embodiments, the computing device 400 may provide USB connections (not shown) to receive handheld USB storage devices such as the USB Flash Drive line of devices manufactured by Twintech Industry, Inc. of Los Alamitos, Calif.

Referring again to FIG. 4B, the computing device 400 may support any suitable installation device 416, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 400 may further include a storage device, such as one or more hard disk drives or redundant arrays of independent disks, for storing an operating system and other related software, and for storing application software programs such as any program or software 420 for implementing (e.g., configured and/or designed for) the systems and methods described herein. Optionally, any of the installation devices 416 could also be used as the storage device. Additionally, the operating system and the software can be run from a bootable medium.

Furthermore, the computing device 400 may include a network interface 418 to interface to the network 404 through a variety of connections including, but not limited to, standard telephone lines, LAN or WAN links (e.g., 802.11, T1, T3, 56kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 400 communicates with other computing devices 400' via any type and/or form of gateway or tunneling protocol such as Secure Socket Layer (SSL) or Transport Layer Security (TLS). The network interface 418 may include a built-in network adapter, network interface card, PCMCIA network card, card bus network adapter, wireless network adapter, USB network adapter, modem or any other device suitable for interfacing the computing device 400 to any type of network capable of communication and performing the operations described herein.

In some embodiments, the computing device 400 may include or be connected to one or more display devices 424a-424n. As such, any of the I/O devices 430a-430n and/or the I/O controller 423 may include any type and/or form of suitable hardware, software, or combination of hardware and software to support, enable or provide for the connection and use of the display device(s) 424a-424n by the computing device 400. For example, the computing device 400 may include any type and/or form of video adapter, video card, driver, and/or library to interface, communicate, connect or otherwise use the display device(s) 424a-424n. In one embodiment, a video adapter may include multiple connectors to interface to the display device(s) 424a-424n. In other embodiments, the computing device 400 may include multiple video adapters, with each video adapter connected to the display device(s) 424a-424n. In some embodiments, any portion of the operating system of the computing device 400 may be configured for using multiple displays 424a-424n. One ordinarily skilled in the art will recognize and appreciate the various ways and embodiments that a computing device 400 may be configured to have one or more display devices 424a-424n.

In further embodiments, an I/O device 430 may be a bridge between the system bus 450 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 400 of the sort depicted in FIGS. 4B and 4C may operate under the control of an operating system, which control scheduling of tasks and access to system resources. The computing device 400 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y. and Linux, a freely-available operating system distributed by Caldera Corp. of Salt Lake City, Utah, or any type and/or form of a Unix operating system, among others.

The computer system 400 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 400 has sufficient processor power and memory capacity to perform the operations described herein.

In some embodiments, the computing device 400 may have different processors, operating systems, and input devices consistent with the device. For example, in one embodiment, the computing device 400 is a smart phone, mobile device, tablet or personal digital assistant. In still other embodiments, the computing device 400 is an Android-based mobile device, an iPhone smart phone manufactured by Apple Computer of Cupertino, Calif., or a Blackberry or WebOS-based handheld device or smart phone, such as the devices manufactured by Research In Motion Limited. Moreover, the computing device 400 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Although the disclosure may reference one or more "users", such "users" may refer to user-associated devices or stations (STAs), for example, consistent with the terms "user" and "multi-user" typically used in the context of a multi-user multiple-input and multiple-output (MU-MIMO) environment.

Although examples of communications systems described above may include devices and APs operating according to an 802.11 standard, it should be understood that embodiments of the systems and methods described can operate according to other standards and use wireless communications devices other than devices configured as devices and APs. For example, multiple-unit communication interfaces associated with cellular networks, satellite communications, vehicle communication networks, and other non-802.11 wireless networks can utilize the systems and methods described herein to achieve improved overall capacity and/or link quality without departing from the scope of the systems and methods described herein.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some embodiments, on multiple machines in a distributed system. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C#, PROLOG, or in any byte code language such as JAVA. The software programs or executable instructions may be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

While the switches in the above described figure(s) can be field effect transistors (FETs), as one of ordinary skill in the art will appreciate, the switches may be implemented using any type of micromechanical switch (MEMS) of transistor structure including, but not limited to, bipolar, metal oxide semiconductor field effect transistors (MOSFET), N-well transistors, P-well transistors, enhancement mode, depletion mode, and zero voltage threshold (VT) transistors.

The transceiver has been described above with the aid of functional building blocks illustrating the performance of certain significant functions. The boundaries of these functional building blocks have been arbitrarily defined for convenience of description. Functions and structures can be integrated together across such boundaries. Alternate boundaries could be defined as long as the certain significant functions are appropriately performed. Similarly, flow diagram blocks may also have been arbitrarily defined herein to illustrate certain significant functionality. To the extent used, the flow boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

We claim:

1. A transmitter, comprising:
    a first circuit disposed on substrate and configured to provide a first analog signal;
    a second circuit disposed on the substrate and configured to provide a second analog signal; and
    a third circuit disposed on the substrate for the first circuit and the second circuit, the third circuit having a first switch for the first circuit and the second circuit configured to apply a reference voltage to the first circuit and the second circuit in response to a digital signal, wherein the second circuit is configured to provide a first signal for echo cancelling.

2. The transmitter of claim 1, wherein the first signal is provided to a summer, and wherein the summer receives a second signal at an I/O pin of a package containing the substrate.

3. The transmitter of claim 2, wherein input/output (I/O) pin is a media dependent interface (MDI) pin.

4. The transmitter of claim 3, wherein the transmitter is configured so that media dependent interface (MDI) pins are configured to be coupled to link partner pins through an ethernet cable.

5. The transmitter of claim 1, wherein the first switch is coupled to a first resistor for the first circuit and a second resistor for the second circuit.

6. The transmitter of claim 1, wherein the first switch is a set of switches, whereby the third circuit is an active circuit allows distortion contributed by the first circuit and the second circuit to be reduced.

7. The transmitter of claim 1, wherein distortion and noise of the first circuit and the second circuit are matched.

8. The transmitter of claim 1, wherein the first circuit is a first digital-to-analog converter circuit and the second circuit is a second digital-to-analog converter circuit, wherein the first digital-to-analog converter circuit and the second digital-to-analog converter circuit each comprise legs, wherein the third circuit is an active circuit comprising at least two switches for each leg.

9. The transmitter of claim 8, wherein the first digital-to-analog converter circuit and the second digital-to-analog converter circuit are sigma delta converters.

10. The transmitter of claim 1, wherein the transmitter is configured as a wireless transmitter.

11. A method, comprising:
    providing a digital input to a first circuit disposed on substrate and a second circuit disposed on the substrate;
    switching an active circuit disposed on the substrate for the first circuit and the second circuit using the digital input to provide a first analog signal and a second analog signal, wherein the first circuit and the second circuit share a switch in the active circuit; and
    providing the second analog signal to a summer for echo cancelling.

12. The method of claim 11, wherein the switch is common to the first circuit and the second circuit.

13. The method of claim 11, wherein the summer receives the first analog signal.

14. The method of claim 11, wherein nonlinearity at a receiver is removed.

15. A transceiver, comprising:
    a transmitter, comprising:
        a first passive circuit comprised of first passive elements;
        a second passive circuit comprised of second passive elements; and
        switches for the first passive circuit and the second passive circuit, the switches comprises a shared switch for a first passive element of the first passive elements and a second element of the second passive elements, wherein the second passive circuit is configured to provide a second analog signal and the first passive circuit is configured to provide a first analog signal for transmission;
a summer coupled to the transmitter; and
a receiver.

16. The transceiver of claim 15, wherein the second analog signal is provided to the summer, and wherein the summer receives a receive signal at an input/output (I/O) pin of a package containing the transceiver.

17. The transceiver of claim 16, wherein the shared switch is coupled to a first resistor for the first passive circuit and a second resistor for the second passive circuit.

18. The transceiver of claim 16, whereby the shared switch allows distortion contributed by the first passive circuit and the second passive circuit to be reduced.

19. The transceiver of claim 16, wherein the input/output (I/O) pin is a media dependent interface (MDI) pin.

20. The transceiver of claim 16, wherein the first passive circuit and the second passive circuit are arranged in legs, and the legs comprise two switches shared by the first passive elements and the second passive elements in each of the legs.

* * * * *